United States Patent
Bai

(10) Patent No.: US 11,251,253 B2
(45) Date of Patent: Feb. 15, 2022

(54) ORGANIC LIGHT-EMITTING DIODE ARRAY SUBSTRATE AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Sihang Bai, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 448 days.

(21) Appl. No.: 16/464,225

(22) PCT Filed: Mar. 6, 2019

(86) PCT No.: PCT/CN2019/077182
§ 371 (c)(1),
(2) Date: May 24, 2019

(87) PCT Pub. No.: WO2020/118920
PCT Pub. Date: Jun. 18, 2020

(65) Prior Publication Data
US 2021/0327993 A1    Oct. 21, 2021

(30) Foreign Application Priority Data
Dec. 13, 2018 (CN) .......................... 201811526215.1

(51) Int. Cl.
*H01L 27/32* (2006.01)
*H01L 51/56* (2006.01)

(52) U.S. Cl.
CPC ...... *H01L 27/3276* (2013.01); *H01L 27/3258* (2013.01); *H01L 27/3262* (2013.01); *H01L 51/56* (2013.01); *H01L 2227/323* (2013.01)

(58) Field of Classification Search
CPC .............................. H01L 27/32; H01L 51/36
See application file for complete search history.

(56) References Cited

U.S. PATENT DOCUMENTS 6,140,672 A * 10/2000 Arita ................. H01L 21/76895
257/295
6,730,950 B1 * 5/2004 Seshadri ........... H01L 21/76895
257/295
(Continued)

FOREIGN PATENT DOCUMENTS

CN    202905716 U    4/2013
CN    103985736 A    8/2014
(Continued)

*Primary Examiner* — Dunga A. Le
(74) *Attorney, Agent, or Firm* — Osha Bergman Watanabe & Burton LLP

(57) ABSTRACT

An organic light-emitting diode array substrate and manufacturing method thereof are provided. The manufacturing method includes forming a semiconductor layer, a gate insulating layer, a gate, and a first insulating layer on a substrate; forming a first metal pattern on the first insulating layer, and the first metal pattern connecting to the gate through the through hole; forming a second insulating layer covering the first metal pattern on the first insulating layer; and forming a second metal pattern on the second insulating layer so that the second metal pattern and the first metal pattern overlap each other to form a capacitor.

14 Claims, 6 Drawing Sheets

(56) References Cited

U.S. PATENT DOCUMENTS

| | | | |
|---|---|---|---|
| 7,531,862 B2* | 5/2009 | Fujimori | H01L 27/0805 |
| | | | 257/295 |
| 2003/0141811 A1 | 7/2003 | Park et al. | |
| 2007/0278480 A1* | 12/2007 | Hwang | H01L 27/1255 |
| | | | 257/40 |
| 2015/0243722 A1 | 8/2015 | Kwon et al. | |
| 2016/0268361 A1 | 9/2016 | Wang et al. | |
| 2018/0108720 A1* | 4/2018 | Kim | H01L 27/1225 |

FOREIGN PATENT DOCUMENTS

| | | |
|---|---|---|
| CN | 203850301 U | 9/2014 |
| CN | 105590580 A | 5/2016 |
| CN | 205609526 U | 9/2016 |

* cited by examiner

ORGANIC LIGHT-EMITTING DIODE ARRAY SUBSTRATE AND MANUFACTURING METHOD THEREOF

FIELD OF INVENTION

The present invention relates to a field of display, and more particularly, to an organic light-emitting diode array substrate and a manufacturing method.

BACKGROUND OF INVENTION

Because organic light-emitting diode (OLED) display panels have advantages of self-luminescence, simple structures, wide viewing angles, high color saturation, fast response times, lightness and thinness compared with liquid crystal display (LCD) panels, products with displays are beginning to adopt OLED panels, such as smart phones and wearable devices, etc. With increasing commercial applications of the OLED panels, people have more requirements for OLED performance, such as higher brightness, higher efficiency, lower power consumption, higher stability, and the like.

Based on the above requirements, it is particularly important to improve electrical performance of an OLED array layout. At present, a mainstream OLED array is a pixel circuit using seven thin film transistors and a capacitor (7T1C), as shown in FIG. 1, wherein a gate of a thin film transistor T1 serves as a bottom electrode plate of a capacitor C1 in the existing technology. The capacitor C1 is required to have a greater capacitance value for better electrical performance. The capacitance value of the capacitor C1 is proportional to a capacitor area and a dielectric constant, and inversely proportional to a distance between electrode plates. In existing technology, increasing the capacitance value is carried out by the following three approaches: increasing the capacitor area, increasing the dielectric constant, or reducing a distance between the electrode plates. Reducing the distance between the electrode plates leads to a decrease in the thickness of a dielectric layer, and increases a risk of breakdown. The dielectric constant relates to materials, so increasing the capacitor area is the most feasible approach.

However, a low-temperature polysilicon active layer and a gate area of the thin film transistor T1 are limited by the demand for high pixel per inch (PPI). If the gate of the thin film transistor T1 serves as the bottom electrode plate of the capacitor, the capacitor area is limited by the gate area. Therefore, it is necessary to develop a novel OLED array structure, which can meet a design of high pixel density and provide a larger capacitor area to satisfy more excellent storage capacities.

Therefore, it is necessary to provide an organic light-emitting diode array substrate and a manufacturing method thereof to solve the problems of the prior art.

SUMMARY OF INVENTION

In view of the shortcomings of the existing technology, the major object of the present invention is to provide an organic light-emitting diode array substrate and manufacturing method thereof, which can make the capacitor in the pixel circuit using 7T1C no longer limited by the gate area of the thin film transistor.

In order to achieve the above-mentioned object of the present invention, the technical solutions provided by the present invention are as follows:

The present invention provides a manufacturing method of an organic light-emitting diode array substrate, including steps of: sequentially forming a semiconductor layer, a gate insulating layer, a gate, and a first insulating layer on a substrate, wherein the semiconductor layer includes an active region, a source region, and a drain region; forming a through hole in the first insulating layer to partially expose the gate; forming a first metal pattern on the first insulating layer corresponding to a position of the gate, wherein the first metal pattern is connected to the gate through the through hole; forming a second insulating layer on the first insulating layer to cover the first metal pattern; forming a second metal pattern on the second insulating layer corresponding to a position of the first metal pattern, wherein the second metal pattern and the first metal pattern overlap each other to form a capacitor; forming an interlayer dielectric layer on the second insulating layer to cover the second metal pattern; forming a plurality of first vias passing through the gate insulating layer, the first insulating layer, the second insulating layer, and the interlayer dielectric layer at positions corresponding to the source region and the drain region; forming at least two third metal patterns on the interlayer dielectric layer, wherein the third metal patterns are connected to the source region and the drain region through the first vias, respectively; forming a planarization layer on the interlayer dielectric layer to cover the third metal patterns; and forming an organic light-emitting diode and a pixel definition layer on the planarization layer.

In one embodiment of the present invention, the step of forming an organic light-emitting diode and a pixel definition layer on the planarization layer includes: forming a second via passing through the planarization layer to expose the third metal pattern connecting to the drain region; forming a first electrode of the organic light-emitting diode on the planarization layer, wherein the first electrode is connected to the third metal pattern through the second via; and forming the pixel definition layer on the planarization layer, wherein the pixel definition layer includes an opening exposing the first electrode.

In one embodiment of the present invention, an area of the second metal pattern and an area of the first metal are both larger than an area of the gate.

In one embodiment of the present invention, before the step of sequentially forming a semiconductor layer, a gate insulating layer, a gate, and a first insulating layer on a substrate, further includes following step of: forming a first flexible layer, an inorganic film layer, a second flexible layer, and a buffer layer on the substrate, wherein the semiconductor layer is formed on the buffer layer.

In one embodiment of the present invention, the third metal patterns connecting to the source region and the drain region, the gate, and the semiconductor layer constitute a first transistor.

The present invention further provides a manufacturing method of an organic light-emitting diode array substrate, including steps of: sequentially forming a semiconductor layer, a gate insulating layer, a gate, and a first insulating layer on a substrate, wherein the semiconductor layer includes an active region, a source region, and a drain region; forming a through hole in the first insulating layer to partially expose the gate; forming a first metal pattern on the first insulating layer corresponding to a position of the gate, wherein the first metal pattern is connected to the gate through the through hole; forming a second insulating layer on the first insulating layer to cover the first metal pattern; and forming a second metal pattern on the second insulating layer corresponding to a position of the first metal pattern, wherein the second metal pattern and the first metal pattern overlap each other to form a capacitor.

In one embodiment of the present invention, the manufacturing method further includes following steps of: forming an interlayer dielectric layer on the second insulating layer to cover the second metal pattern; and forming a third metal pattern on the interlayer dielectric layer.

In one embodiment of the present invention, the step of forming a third metal pattern on the interlayer dielectric layer includes: forming a plurality of first vias passing through the gate insulating layer, the first insulating layer, the second insulating layer, and the interlayer dielectric layer at positions corresponding to the source region and the drain region; and forming at least two third metal patterns on the interlayer dielectric layer, wherein each of the third metal patterns are connected to the source region and the drain region through the first vias, respectively.

In one embodiment of the present invention, the manufacturing method further includes following steps of: forming a planarization layer on the interlayer dielectric layer to cover the third metal pattern; and forming an organic light-emitting diode and a pixel definition layer on the planarization layer.

In one embodiment of the present invention, the step of forming an organic light-emitting diode and a pixel definition layer on the planarization layer includes: forming a second via passing through the planarization layer to expose the third metal pattern connecting to the drain region; forming a first electrode of the organic light-emitting diode on the planarization layer, wherein the first electrode is connected to the third metal pattern through the second via; and forming the pixel definition layer on the planarization layer, wherein the pixel definition layer includes an opening exposing the first electrode.

In one embodiment of the present invention, an area of the second metal pattern and an area of the first metal are larger than an area of the gate.

In one embodiment of the present invention, before the step of sequentially forming a semiconductor layer, a gate insulating layer, a gate, and a first insulating layer on a substrate, wherein the semiconductor layer includes an active region, a source region, and a drain region further includes following step of: forming a first flexible layer, an inorganic film layer, a second flexible layer, and a buffer layer on the substrate; wherein the semiconductor layer is formed on the buffer layer.

In one embodiment of the present invention, the third metal patterns connecting to the source region and the drain region, the gate, and the semiconductor layer constitute a first transistor.

The present invention further provides an organic light-emitting diode array substrate, comprising a substrate, a semiconductor layer, a gate insulating layer, a gate, a first insulating layer, a first metal pattern, a second insulating layer, and a second metal pattern; the semiconductor layer disposed on the substrate, and the semiconductor layer comprising an active region, a source region, and a drain region; the gate insulating layer covering the semiconductor layer; the gate disposed on the gate insulating layer and corresponding to the active region of the semiconductor layer; the first insulating layer disposed on the gate and the first insulating layer comprising a through hole, wherein the through hole partially exposes the gate; the first metal pattern disposed on the first insulating layer, wherein the first metal pattern is connected to the gate through the through hole; the second insulating layer disposed on the first insulating layer and covering the first metal pattern; the second metal pattern disposed on the second insulating layer and corresponding to a position of the first metal pattern, wherein the second metal pattern and the first metal pattern overlap each other to form a capacitor.

In one embodiment of the present invention, a pixel unit of the organic light-emitting diode array substrate includes a first transistor, a second transistor, a third transistor, a fourth transistor, a fifth transistor, a sixth transistor, a seventh transistor, the capacitor, and an organic light-emitting diode.

The beneficial effect: in the process of forming the organic light-emitting diode array substrate, the two metal pattern layers can be used as a capacitor in the pixel circuit by depositing the two metal pattern layers over the gate of the driving transistor in the pixel circuit. Thus, the area of the two electrode plates constituting the capacitor is no longer limited by the gate area of the driving transistor, which is more advantageous for the improvement of the storage capacitor capability.

DESCRIPTION OF DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

DETAILED DESCRIPTION OF PREFERRED EMBODIMENTS

Figure 1:
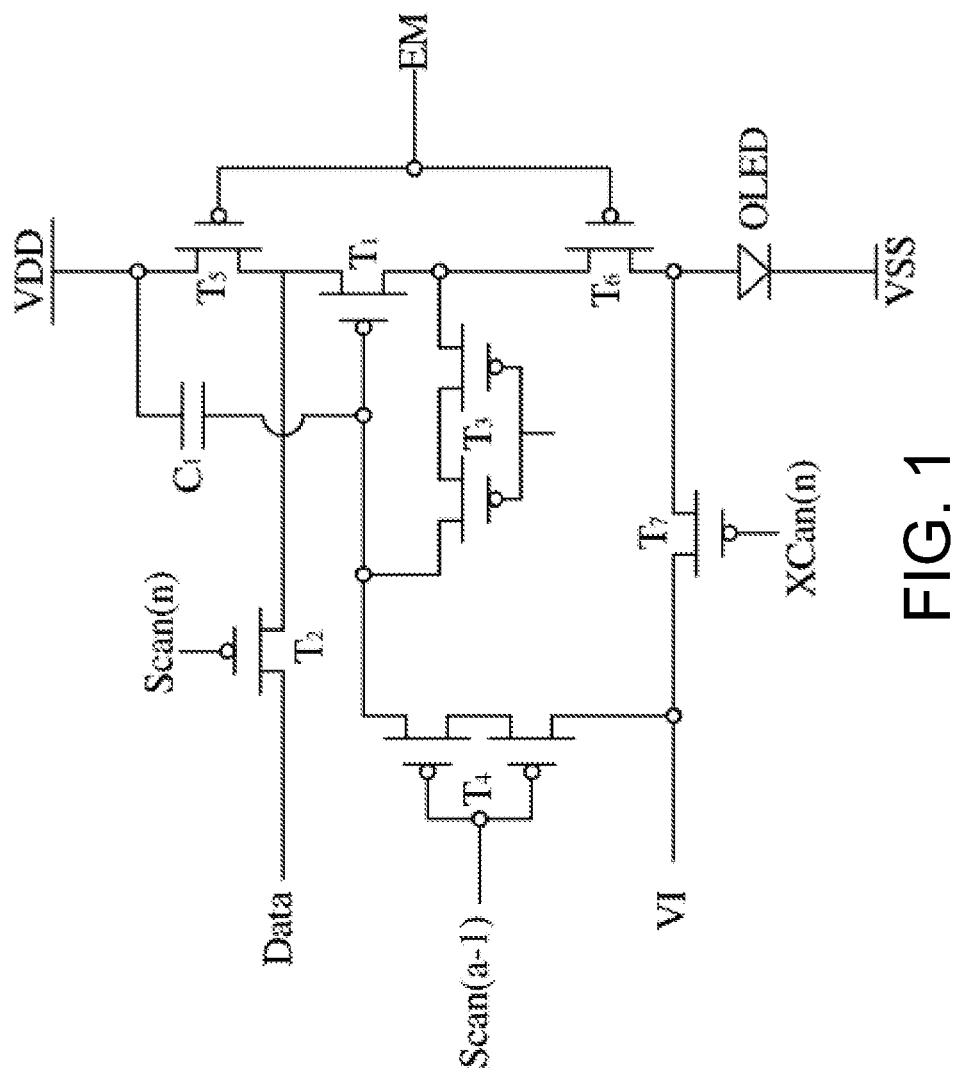
FIG. 1 is a schematic diagram of a pixel circuit using seven thin film transistors and a capacitor (7T1C) in an existing organic light-emitting diode array substrate.

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting. Throughout this specification and in the drawings like parts will be referred to by the same reference numerals.

Figure 2:
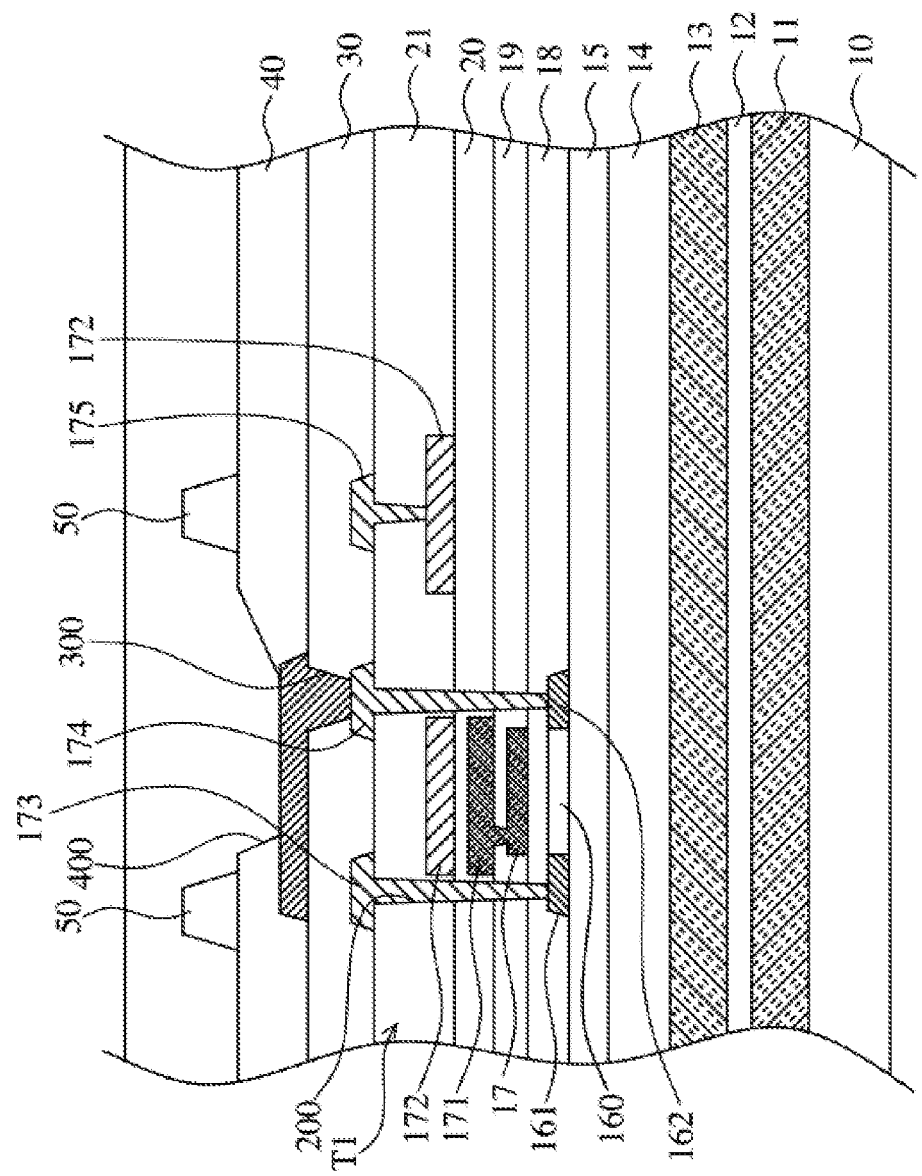
FIG. 2 is a partial cross-sectional view of an organic light-emitting diode array substrate according to an embodiment of the present invention.
Figure 3A:
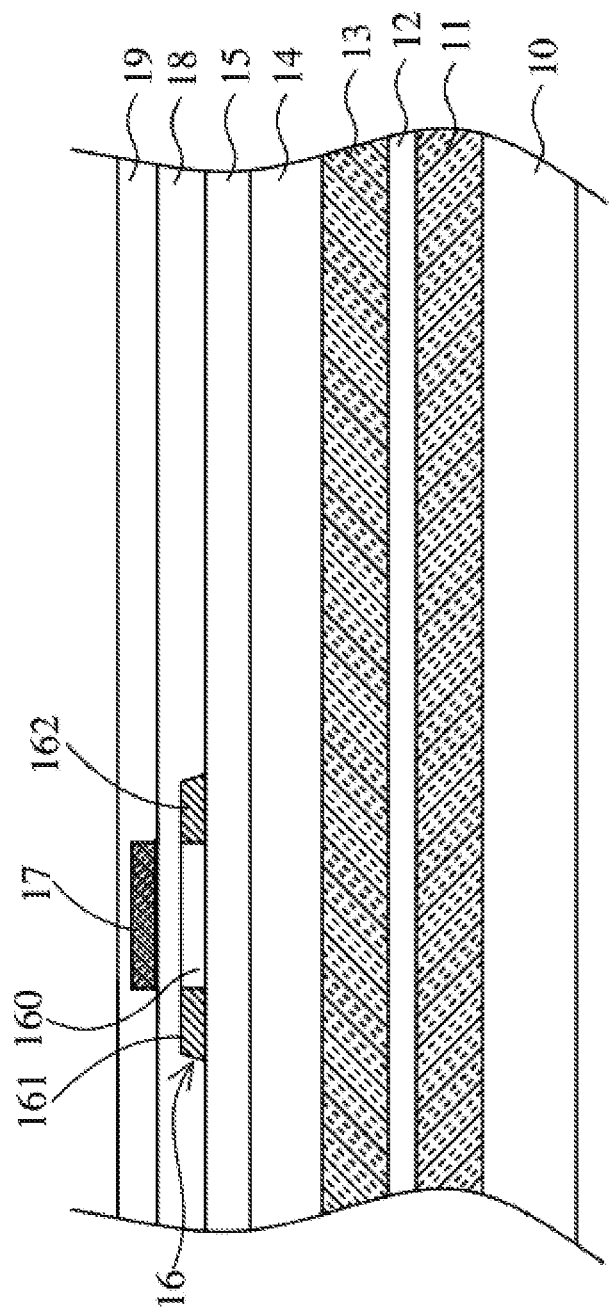
FIGS. 3A to 3C are schematic diagrams showing manufacturing processes of an organic light-emitting diode array substrate according to an embodiment of the present invention.
Figure 3B:
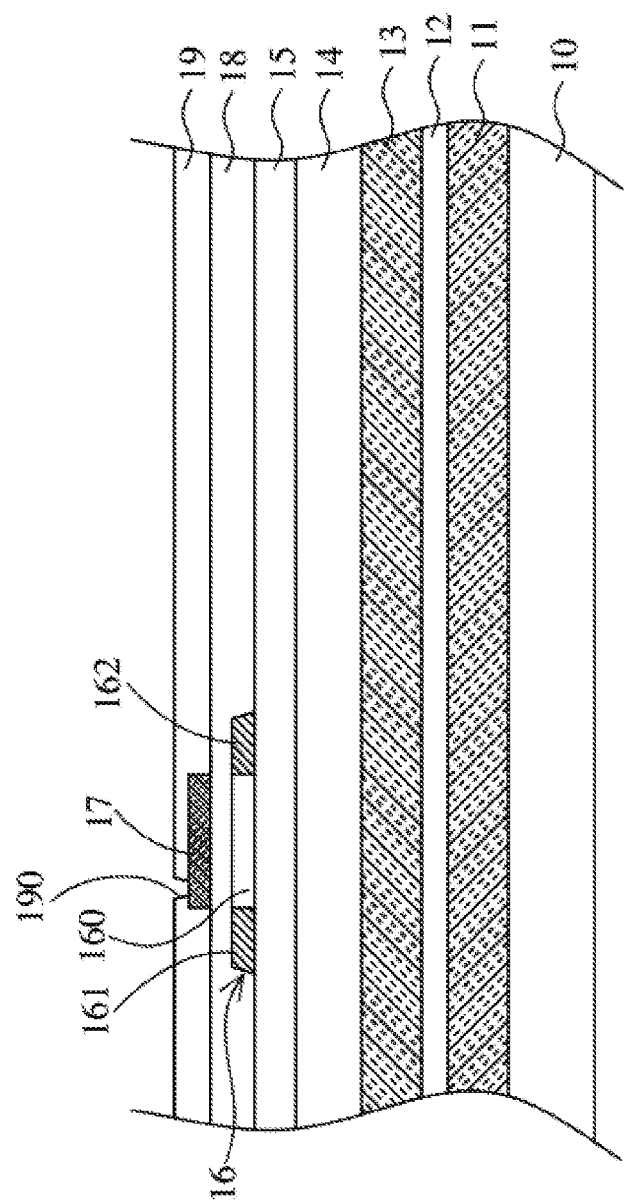
Figure 3C:
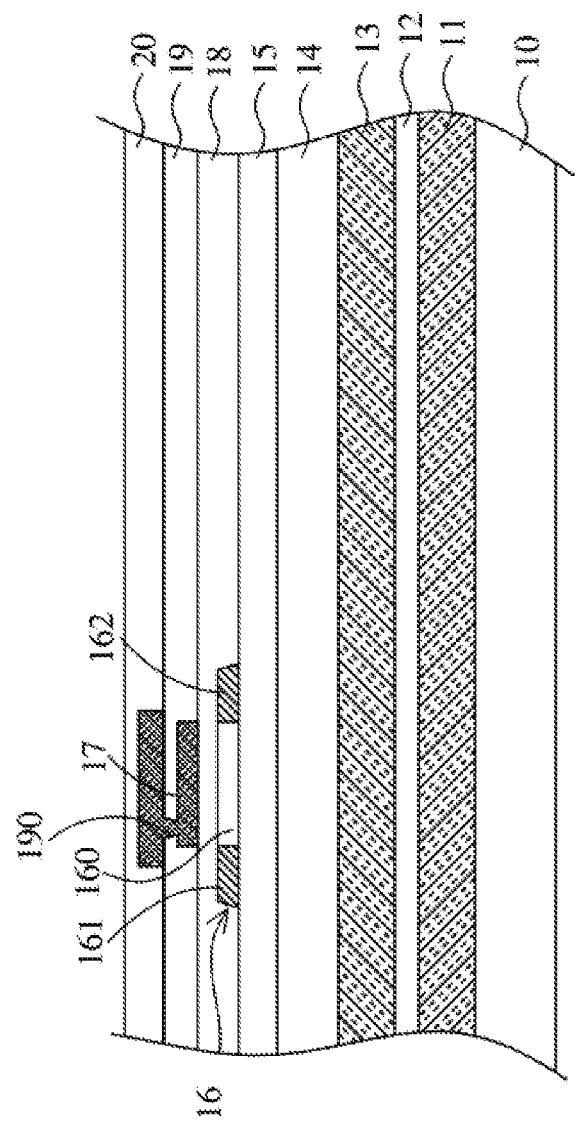
Figure 4:
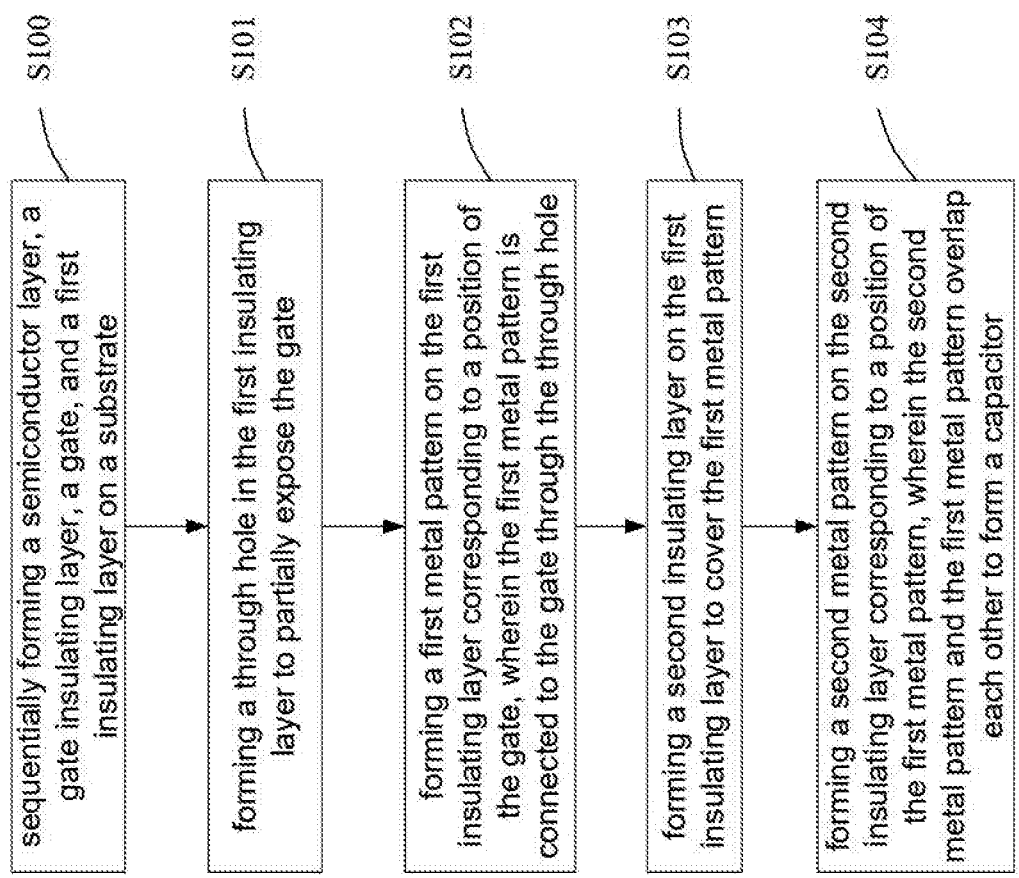
FIG. 4 is a flowchart showing a manufacturing method of an organic light-emitting diode array substrate according to an embodiment of the present invention.

Please refer to FIG. 2 and FIGS. 3A to 3C. FIG. 2 is a partial cross-sectional view of an organic light-emitting diode array substrate according to an embodiment of the present invention. FIGS. 3A to 3C are schematic diagrams showing manufacturing processes of an organic light-emitting diode array substrate according to an embodiment of the present invention.

A pixel driving circuit using seven thin film transistors and a capacitor (7T1C) is adopted in the organic light-emitting diode array substrate of the present invention, and a pixel unit of the organic light-emitting diode array substrate includes a first transistor, a second transistor, a third transistor, a fourth transistor, a fifth transistor, a sixth transistor, a seventh transistor, a capacitor, and an organic light-emitting diode, wherein the first transistor serves as a driving transistor for driving the organic light-emitting diode.

The organic light-emitting diode array substrate is mainly improved for the first transistor and the capacitor. Therefore, the partial cross-sectional view of the organic light-emitting diode array substrate shown in FIG. 2 mainly shows the structure of the first transistor and the capacitor in one pixel unit, and mainly includes a substrate 10, a first transistor T1, and a capacitor.

Specifically, the substrate 10 may be a glass substrate, a first flexible layer 11, an organic film layer 12, a second flexible layer 13, an M/B layer 14, and a buffer layer 15 can be further disposed on the substrate 10, sequentially. The first flexible layer 11 and the second flexible layer 13 may be flexible plastic substrates. The inorganic film layer 12 may be a silicon dioxide film layer. The buffer layer 15 may be an inorganic material, for example, a combination of one or more of silicon nitride, silicon oxide, silicon oxycarbide, silicon oxynitride, and silicon carbonitride.

Specifically, the first transistor T1 includes a semiconductor layer 16, a gate insulating layer 18, a gate 17, a source 173, and a drain 174. The semiconductor layer 16 is specifically disposed on the substrate 10 and may be disposed on the buffer layer 15, and the semiconductor layer includes an active region 160, a source region 161, and a drain region 162. The gate insulating layer 18 is formed on the buffer layer 15 to cover the semiconductor layer 16. The gate 17 is formed on the gate insulating layer 18 and corresponding to the active region 160 of the semiconductor layer 16. The source 173 and the drain 174 are connected to the source region 161 and the drain region 162 of the semiconductor layer 16 through a through hole 200 respectively, thereby constituting the first transistor T1.

In the organic light-emitting diode array substrate of the present invention, the capacitor is disposed above the first transistor T1, wherein the capacitor includes a bottom electrode plate 171 and a top electrode plate 172. The bottom electrode plate 171 is disposed above the gate 17 of the first transistor T1, and the bottom electrode plate 171 is connected to the gate 17 such that the bottom electrode plate 171 and the gate 17 are equipotential. The top electrode plate 172 is disposed in parallel above the bottom electrode plate 171. Specifically, a first insulating layer 19 is first disposed on the gate 17 and a through hole 190 is formed to partially expose the gate 17. Then, a first metal pattern is formed on the first insulating layer 19 to serves as a bottom electrode plate 171, and the bottom electrode plate 17 (the first metal pattern) is connected to the gate 17 through the through hole 190. A second insulating layer 20 is then disposed on the first insulating layer 19 to cover the bottom electrode plate 171 (the first metal pattern). A second metal pattern is then formed on the second insulating layer 20 and corresponds to a position of the bottom electrode plate 171 (the first metal pattern) to serves as the top electrode plate 172. Thereby, the top electrode plate 172 (the second metal pattern) and the bottom electrode plate 171 (the first metal pattern) constitute the capacitor.

An area of the bottom electrode plate 171 and an area of the top electrode plate 172 may be both larger than an area of the gate.

As can be seen from the above structure, because the bottom electrode plate 171 constituting the capacitor is additionally deposited over the gate 17, the area of the bottom electrode plate 171 is no longer limited by the gate area of the driving transistor. The bottom electrode plate 171 can be designed to be larger than the area of the gate 17, which is more advantageous for the improvement of the storage capacitor capability.

Please refer to FIGS. 3A to 3C and FIG. 4, in order to provide the organic light-emitting diode array substrate as above-described, a manufacturing method of an organic light-emitting diode array substrate is provided. The manufacturing method mainly includes the following steps S100 to S104:

Step S100, sequentially forming a semiconductor layer 16, a gate insulating layer 18, a gate 17, and a first insulating layer 19 on a substrate 10, wherein the semiconductor layer 16 includes an active region 160, a source region 161, and a drain region 162, as shown in FIG. 3A.

Step S101, forming a through hole 190 in the first insulating layer 19 to partially expose the gate 17, as shown in FIG. 3B.

Step S102, forming a first metal pattern 171 on the first insulating layer 19 corresponding to a position of the gate 17, wherein the first metal pattern 171 is connected to the gate 17 through the through hole 190, as shown in FIG. 3C.

Step S103, forming a second insulating layer 20 on the first insulating layer 19 to cover the first metal pattern 17, as shown in FIG. 3C.

Step S104, forming a second metal pattern 172 on the second insulating layer 20 corresponding to a position of the first metal pattern 171, wherein the second metal pattern 172 and the first metal pattern 171 overlap each other to form a capacitor, as shown in FIG. 2.

In one embodiment, before the step S100 further includes following step of:

Forming a first flexible layer 11, an inorganic film layer 12, a second flexible layer 13, and a buffer layer 15 on the substrate 10, wherein the semiconductor layer 16 is formed on the buffer layer 15.

In one embodiment, the manufacturing method further includes following steps of:

Forming an interlayer dielectric layer 21 on the second insulating layer 20 to cover the second metal pattern 172.

Forming a third metal pattern (173, 174, 175) on the interlayer dielectric layer 21.

The interlayer dielectric layer 21 may be an inorganic material, such as silicon oxide (SiOx), silicon nitride (SiNx), or a layered structure (SiOx/SiNx or SiNx/SiOx).

Specifically, the step of forming a third metal pattern (173, 174, 175) on the interlayer dielectric layer includes:

Forming a plurality of first vias 200 passing through the gate insulating layer 18, the first insulating layer 19, the second insulating layer 20, and the interlayer dielectric layer 21 at positions corresponding to the source region 161 and the drain region 162.

Forming at least two third metal patterns (173, 174) on the interlayer dielectric layer, wherein each of the third metal patterns (172, 174) are connected to the source region 161 and the drain region 162 through the first vias 200, respectively. The third metal pattern connecting to the source region 161 and the drain region 162 forms the source 173 and the drain 174. The source 173, the drain 174, the gate 17, and the semiconductor layer 16 constitute a first transistor T1.

In one embodiment, the manufacturing method further includes following steps of:

Forming a planarization layer 30 on the interlayer dielectric layer 21 to cover the third metal pattern (173, 174, 175).

Forming an organic light-emitting diode, a pixel definition layer 40 and a plurality of support elements on the planarization layer 30. The planarization layer 30 may be a single layer structure or a multilayered structure, and material of the planarization layer 30 may include an inorganic material, an organic material, or other suitable materials. The inorganic material includes, for example, but not limited to, silicon oxide, silicon nitride or silicon oxynitride. The organic material includes, for example, but not limited to, an epoxy resin.

Specifically, the step of forming an organic light-emitting diode, a pixel definition layer 40 and a plurality of support elements on the planarization layer 30 include:

Forming a second via 300 passing through the planarization layer 30 to expose the third metal pattern 174 connecting to the drain region 162.

Forming a first electrode 60 of the organic light-emitting diode on the planarization layer 30, wherein the first electrode 60 is connected to the third metal pattern 174 (i.e., the drain) through the second via 300.

Forming the pixel definition layer 40 on the planarization layer 30, wherein the pixel definition layer 40 comprises an opening 400 exposing the first electrode 60.

After the first electrode 60 (i.e., an anode) of the organic light-emitting diode is formed, the subsequent manufacturing steps of the organic light-emitting diode are similar to the existing technology, and will not be described herein.

Specifically, the area of the second metal pattern 172 and of the first metal pattern 171 may be larger than the area of the gate 17 to enhance storage capacities.

In summary, compared with the existing technology, the present invention provides two metal layers serving as the top/bottom electrode plate of the capacitor in the pixel circuit using 7T1C by depositing the two metal pattern layers over the gate of the driving transistor in the pixel circuit. Thus, the area of the two electrode plates constituting the capacitor is no longer limited by the gate area of the driving transistor, the area of the storage capacitor is increased, the storage capacity is increased, and the response rate is improved, and the signal transmission is more timely.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A manufacturing method of an organic light-emitting diode array substrate, comprising steps of:
   sequentially forming a semiconductor layer, a gate insulating layer, a gate, and a first insulating layer on a substrate, wherein the semiconductor layer comprises an active region, a source region, and a drain region;
   forming a through hole in the first insulating layer to partially expose the gate;
   forming a first metal pattern on the first insulating layer corresponding to a position of the gate, wherein the first metal pattern is connected to the gate through the through hole;
   forming a second insulating layer on the first insulating layer to cover the first metal pattern;
   forming a second metal pattern on the second insulating layer corresponding to a position of the first metal pattern, wherein the second metal pattern and the first metal pattern overlap each other to form a capacitor;
   forming an interlayer dielectric layer on the second insulating layer to cover the second metal pattern;
   forming a plurality of first vias passing through the gate insulating layer, the first insulating layer, the second insulating layer, and the interlayer dielectric layer at positions corresponding to the source region and the drain region;
   forming at least two third metal patterns on the interlayer dielectric layer, wherein the third metal patterns are connected to the source region and the drain region through the first vias, respectively;
   forming a planarization layer on the interlayer dielectric layer to cover the third metal patterns; and
   forming an organic light-emitting diode and a pixel definition layer on the planarization layer.

2. The manufacturing method of the organic light-emitting diode array substrate according claim 1, wherein the step of forming the organic light-emitting diode and the pixel definition layer on the planarization layer comprises:
   forming a second via passing through the planarization layer to expose the third metal pattern connecting to the drain region;
   forming a first electrode of the organic light-emitting diode on the planarization layer, wherein the first electrode is connected to the third metal pattern through the second via; and
   forming the pixel definition layer on the planarization layer, wherein the pixel definition layer comprises an opening exposing the first electrode.

3. The manufacturing method of the organic light-emitting diode array substrate according claim 1, wherein an area of the second metal pattern and an area of the first metal are both larger than an area of the gate.

4. The manufacturing method of the organic light-emitting diode array substrate according claim 1, wherein before the step of sequentially forming the semiconductor layer, the gate insulating layer, the gate, and the first insulating layer on the substrate, further comprises following step of:
   forming a first flexible layer, an inorganic film layer, a second flexible layer, and a buffer layer on the substrate, wherein the semiconductor layer is formed on the buffer layer.

5. The manufacturing method of the organic light-emitting diode array substrate according claim 1, wherein the third metal patterns connecting to the source region and the drain region, the gate, and the semiconductor layer constitute a first transistor.

6. A manufacturing method of an organic light-emitting diode array substrate, comprising steps of:
   sequentially forming a semiconductor layer, a gate insulating layer, a gate, and a first insulating layer on a substrate, wherein the semiconductor layer comprises an active region, a source region, and a drain region;
   forming a through hole in the first insulating layer to partially expose the gate;
   forming a first metal pattern on the first insulating layer corresponding to a position of the gate, wherein the first metal pattern is connected to the gate through the through hole;
   forming a second insulating layer on the first insulating layer to cover the first metal pattern; and forming a second metal pattern on the second insulating layer corresponding to a position of the first metal pattern, wherein the second metal pattern and the first metal pattern overlap each other to form a capacitor, wherein an area of the second metal pattern and an area of the first metal are larger than an area of the gate.

7. The manufacturing method of the organic light-emitting diode array substrate according claim 6, wherein the manufacturing method further comprises following steps of:
forming an interlayer dielectric layer on the second insulating layer to cover the second metal pattern; and
forming a third metal pattern on the interlayer dielectric layer.

8. The manufacturing method of the organic light-emitting diode array substrate according claim 7, wherein the step of forming a third metal pattern on the interlayer dielectric layer comprises:
forming a plurality of first vias passing through the gate insulating layer, the first insulating layer, the second insulating layer, and the interlayer dielectric layer at positions corresponding to the source region and the drain region; and
forming at least two third metal patterns on the interlayer dielectric layer, wherein each of the third metal patterns are connected to the source region and the drain region through the first vias, respectively.

9. The manufacturing method of the organic light-emitting diode array substrate according claim 7, wherein the manufacturing method further comprises following steps of:
forming a planarization layer on the interlayer dielectric layer to cover the third metal pattern; and
forming an organic light-emitting diode and a pixel definition layer on the planarization layer.

10. The manufacturing method of the organic light-emitting diode array substrate according claim 9, wherein the step of forming the organic light-emitting diode and the pixel definition layer on the planarization layer comprises:
forming a second via passing through the planarization layer to expose the third metal pattern connecting to the drain region;
forming a first electrode of the organic light-emitting diode on the planarization layer, wherein the first electrode is connected to the third metal pattern through the second via; and
forming the pixel definition layer on the planarization layer, wherein the pixel definition layer comprises an opening exposing the first electrode.

11. The manufacturing method of the organic light-emitting diode array substrate according claim 6, wherein before the step of sequentially forming the semiconductor layer, the gate insulating layer, the gate, and the first insulating layer on the substrate, wherein the semiconductor layer comprises the active region, the source region, and the drain region further comprises following step of:
forming a first flexible layer, an inorganic film layer, a second flexible layer, and a buffer layer on the substrate; wherein the semiconductor layer is formed on the buffer layer.

12. The manufacturing method of the organic light-emitting diode array substrate according claim 8, wherein the third metal patterns connecting to the source region and the drain region, the gate, and the semiconductor layer constitute a first transistor.

13. An organic light-emitting diode array substrate, comprising a substrate, a semiconductor layer, a gate insulating layer, a gate, a first insulating layer, a first metal pattern, a second insulating layer, and a second metal pattern;
the semiconductor layer disposed on the substrate, and the semiconductor layer comprising an active region, a source region, and a drain region;
the gate insulating layer covering the semiconductor layer;
the gate disposed on the gate insulating layer and corresponding to the active region of the semiconductor layer;
the first insulating layer disposed on the gate and the first insulating layer comprising a through hole, wherein the through hole partially exposes the gate;
the first metal pattern disposed on the first insulating layer, wherein the first metal pattern is connected to the gate through the through hole;
the second insulating layer disposed on the first insulating layer and covering the first metal pattern;
the second metal pattern disposed on the second insulating layer and corresponding to a position of the first metal pattern, wherein the second metal pattern and the first metal pattern overlap each other to form a capacitor, wherein an area of the second metal pattern and an area of the first metal are larger than an area of the gate.

14. The organic light-emitting diode array substrate according to claim 13, wherein a pixel unit of the organic light-emitting diode array substrate comprises a first transistor, a second transistor, a third transistor, a fourth transistor, a fifth transistor, a sixth transistor, a seventh transistor, the capacitor, and an organic light-emitting diode.

* * * * *